US006964749B2

(12) United States Patent
Zucker et al.

(10) Patent No.: US 6,964,749 B2
(45) Date of Patent: Nov. 15, 2005

(54) THREE-DIMENSIONAL NONWOVEN SUBSTRATE FOR CIRCUIT BOARD

(75) Inventors: Jerry Zucker, Charleston, SC (US); Nick Mark Carter, Mooresville, NC (US)

(73) Assignee: Polymer Group, Inc., North Charleston, SC (US)

( * ) Notice: Subject to any disclaimer, the term of this patent is extended or adjusted under 35 U.S.C. 154(b) by 313 days.

(21) Appl. No.: 10/162,027

(22) Filed: Jun. 4, 2002

(65) Prior Publication Data

US 2003/0008590 A1 Jan. 9, 2003

Related U.S. Application Data

(60) Provisional application No. 60/295,785, filed on Jun. 4, 2001.

(51) Int. Cl.[7] ................................................ B32B 27/04

(52) U.S. Cl. .................. 264/154; 264/171.24; 264/284; 156/158; 427/96; 442/408; 28/104

(58) Field of Search ........................... 264/154, 171.24, 264/284; 156/158; 427/96; 442/408; 28/104

(56) References Cited

U.S. PATENT DOCUMENTS 4,680,220 A 7/1987 Johnson
4,798,762 A 1/1989 Okada et al.
4,833,568 A 5/1989 Berhold
5,141,829 A 8/1992 Dumas et al.
5,264,061 A 11/1993 Juskey et al.
5,268,218 A * 12/1993 Zafiroglu .................... 428/219
5,354,950 A 10/1994 Golane
5,424,921 A 6/1995 Davis, II et al.
5,436,803 A 7/1995 Annis et al.
5,483,407 A 1/1996 Anastasio et al.
5,498,467 A 3/1996 Meola
5,520,976 A 5/1996 Giannetti et al.
5,635,252 A * 6/1997 Fraser et al. ............. 427/430.1
5,784,782 A 7/1998 Boyko et al.

(Continued)

FOREIGN PATENT DOCUMENTS

WO WO 96/07488 3/1996

OTHER PUBLICATIONS

*An Improved Laminate For Embedded Capacitance Applications*, Jeffrey Gotro and Jeffrey Kamla, AlliedSignal Laminate Systems, 5 pages.
*Coated Copper Foils For High Density Interconnects*, James Paulus and Dr. Michael Petti, AlliedSignal Laminate Systmes, 7 pages.
*Thermal Reliability of Laser Ablated Microvias and Standard Through–Hole Technologies*, Todd Young, AlliedSignal Laminate Systems Inc., and Frank Polakovic, Electrochemicals, Inc., 5 pages.
*New Low Dielectric Constant, High Tg, Printed Circuitry Substrates*, Randy Bissell, Jeff Conrad, Eric Holman, Paul Reichenbacher, and the FR408 Team at AlliedSignal Laminate Systems, Inc., 7 pages.
*High Speeds No Roadblocks*, Gore Technologies Worldwide, 3 pages.

*Primary Examiner*—Suzanne E. McDowell
(74) *Attorney, Agent, or Firm*—Wood, Phillips, Katz, Clark & Mortimer

(57) ABSTRACT

The present invention relates to a nonwoven substrate, and specifically to a nonwoven substrate imparted with a three-dimensional image, wherein the three-dimensional nonwoven substrate is particularly suited as a support substrate for a PCB (Printed Circuit Board) and similar application.

By the utilization of a hydroentangled, three-dimensionally imaged support substrate impregnated with a durable resinous matrix, PCB's, and similar applications, can be imparted with unique and useful performance properties, to improve structural performance.

16 Claims, 5 Drawing Sheets

U.S. PATENT DOCUMENTS

| | | | | | |
|---|---|---|---|---|---|
| 5,841,194 | A | | 11/1998 | Tsukamoto | |
| 5,847,327 | A | | 12/1998 | Fischer et al. | |
| 6,143,116 | A | | 11/2000 | Hayashi et al. | |
| 6,143,369 | A | | 11/2000 | Sugawa et al. | |
| 6,143,414 | A | | 11/2000 | Coca et al. | |
| 6,163,957 | A | | 12/2000 | Jiang et al. | |
| 6,168,855 | B1 | | 1/2001 | Cohen et al. | |
| 6,180,215 | B1 | | 1/2001 | Sprietsma et al. | |
| 6,183,592 | B1 | | 2/2001 | Sylvester | |
| 6,197,859 | B1 | | 3/2001 | Green et al. | |
| 6,502,288 | B2 | * | 1/2003 | Black et al. | 28/104 |
| 6,554,963 | B1 | * | 4/2003 | Botelho et al. | 162/289 |
| 6,695,941 | B2 | * | 2/2004 | Hartgrove et al. | 156/148 |

* cited by examiner

WIRING CHANNELS

LIVE HINGE / SNAP BREAK

AIR-TRANSFER GRILL

CIRCUIT BOARD LAYOUT

SUB-BOARD REMOVED FROM MAIN CONSTRUCT AND RELOCATED

Magnification 1X

Magnification 10X

THREE-DIMENSIONAL NONWOVEN SUBSTRATE FOR CIRCUIT BOARD

TECHNICAL FIELD

The present invention relates generally to a nonwoven substrate, and specifically to a nonwoven substrate imparted with a three-dimensional image, wherein the three-dimensional nonwoven substrate is particularly suited as a support substrate for a PCB (Printed Circuit Board) and similar applications.

BACKGROUND OF THE INVENTION

The production of conventional textile substrates for PCB and like applications is known to be a complex, multi-step process. The production of such substrates from staple fibers begins with the carding process where the fibers are opened and aligned into a feedstock known as sliver. Several strands of sliver are then drawn multiple times on a drawing frames to further align the fibers, blend, improve uniformity as well as reduce the sliver's diameter. The drawn sliver is then fed into a roving frame to produce roving by further reducing its diameter as well as imparting a slight false twist. The roving is then fed into the spinning frame where it is spun into yarn. The yarns are next placed onto a winder where they are transferred into larger packages. The yarn is then ready to be used to create a fabric.

For a woven fabric, the yarns are designated for specific use as warp or fill yarns. The fill yarns (which run on the y-axis and are known as picks) are taken straight to the loom for weaving. The warp yarns (which run on the x-axis and are known as ends) must be further processed. The large packages of yarns are placed onto a warper frame and are wound onto a section beam were they are aligned parallel to each other. The section beam is then fed into a slasher where a size is applied to the yarns to make them stiffer and more abrasion resistant, which is required to withstand the weaving process. The yarns are wound onto a loom beam as they exit the slasher, which is then mounted onto the back of the loom. The warp yarns are threaded through the needles of the loom, which raises and lowers the individual yarns as the filling yarns are interested perpendicular in an interlacing pattern thus weaving the yarns into a fabric. Once the fabric has been woven, it is necessary for it to go through a scouring process to remove the size from the warp yarns before it can be dyed or finished. Currently, commercial high-speed looms operate at a speed of 1000 to 1500 picks per minute, where a pick is the insertion of the filling yarn across the entire width of the fabric. Sheeting and bedding fabrics are typically counts of 80×80 to 200×200, being the ends per inch and picks per inch, respectively. The speed of weaving is determined by how quickly the filling yarns are interlaced into the warp yams; therefore looms creating bedding fabrics are generally capable of production speeds of 5 inches to 18.75 inches per minute.

In contrast, the production of nonwoven fabrics from staple fibers and/or filaments is known to be more efficient than traditional textile processes as the fabrics are produced directly from the carding process.

Nonwoven fabrics are suitable for use in a wide variety of applications where the efficiency with which the fabrics can be manufactured provides a significant economic advantage for these fabrics versus traditional textiles. Hydroentangled fabrics have been developed with improved properties, which are a result of the entanglement of the fibers, and/or filaments in the fabric providing improved fabric integrity. Subsequent to entanglement, fabric durability can be further enhanced by the application of binder compositions and/or by thermal stabilization of the entangled fibrous matrix.

Previously, the manufacture of electronic components, such as a printed circuit board, utilized woven fiberglass of either continuous yarns or rovings. Weaving fiberglass is known to be highly detrimental to weaving components, as well as difficult to handle due to hazards imposed by the fine glass filaments. By the utilization of hydroentangled, three-dimensionally imaged support substrates, PCB's, and similar applications, can not only be fabricated from a variety of fibrous components of significantly reduced hazardous nature, but are also imparted with unique and useful performance properties, which improve the overall structural, electrical, and thermal performance of the circuit board. A particular advantage of the improvement in thermal control of the substrate formed in accordance with the present invention, highly temperature sensitive electrical component, such as advanced computer processors, can attain further benefit from the substrate being better able to dissipate heat. With reduced temperature, such things as processor speed and battery life can be increased further.

SUMMARY OF THE INVENTION

The present invention relates to a nonwoven substrate, and specifically to a nonwoven substrate imparted with a three-dimensional image, wherein the three-dimensional nonwoven substrate is particularly suited as a support substrate for a PCB (Printed Circuit Board) and similar application.

By the utilization of a hydroentangled, three-dimensionally imaged support substrate impregnated with a durable resinous matrix, PCB's, and similar applications, can be imparted with unique and useful performance properties, to improve structural performance. The substrate can be directly imparted with inherent properties, which have heretofore required the manufacture of multiple components and fabrication into a useful article, such as: "Reinforcements", to counteract temporary (flex) and permanent (warp) strains, "bolsters", around through-holes at mounting points to prevent cracking, and "guides", for mounting other pieces to the base construct. As well as articles such as, "registration markers", to aid in establishing proper reference orientation during fabrication procedures and automated quality control analyses, "live hinges", which focus flexural energy into a region of the substrate which is most able to accommodate such energy, "rail stops", to prevent exceeding an established reference point during the fabrication of the individual construct or when such constructs are combined into a more complex matrix, "cavities", to allow for the formation of recesses in which to place bulky or otherwise hindered pieces, "apertures", to create a pre-existing through-hole without the need of drilling, "drilling targets", a version based on having an aperture will with only resinous binder. Common and predictable fibrous composition of the matrix in the target facilitates the ability to automate drill-out process, whether in consistency of wattage required to ablate by way of laser, or in drill-bit performance over a finite time period.

To improve the thermal performance of the circuit board, the hydroentangled, three-dimensionally imaged nonwoven support substrate can be constructed such that the presence of heat, which generally has a deleterious effect on electronic components, can be controlled or directed. For instance, the conduction of thermal energy can be directed from a first specified region to a second specified region.

Mass sinking can be controlled, whereby a region of increased mass can be utilized as an endpoint for a thermal conduction path. Further, dynamic sinking can be controlled, whereby a region having the ability to be actively cooled can be utilized as an endpoint for a thermal conduction path. Further still, the nonwoven substrate can be formed into useful cooling projections, such as posts or fins, which combines dynamic sinking with a structural capability.

It is also in the purview of the present invention that the substrate improves the electrical performance of the circuit board. The substrate can be constructed such that when employed as a base for electrical circuitry, certain and specific regions of the substrate exhibit performance beneficial or directly employed by the electronic components attached thereto or thereupon. A specific example of performance-orientated regions include those, which have variable, specific, and/or isolated dielectric attributes. The variable dielectric region may be of a corresponding variance in bulk, or of uniform bulk and the variance a property of mass. The nonwoven support substrate can be used for grounding purposes so as to impart a PCB with the ability to control the buildup of static charge and/or the ability to protect sensitive electronic components from overcharge, as well as provide a PCB with electromagnetic shielding by dissipating an electrical charge induced by a magnetic field.

The substrate of the invention provides an overall benefit to circuit boards, but also can be utilized in other end-use applications including, but not limited to, wireless and satellite communication, computer/microprocessor architecture, and power supply devices.

It is also within the purview of the invention that the substrate may be comprised of a single layer construct or a multi-layer construct. The layers can either be woven substrates, nonwoven substrates, or the combination thereof and may be of the same or differing composition. Further, the support substrate may be of a laminate or composite structure. Further still, the substrate can be integrated, wherein formation of the substrate includes alternate materials to impart different physical properties (i.e. incorporation of a carbon fiber into a PET nonwoven or a glass woven to create an electro conductive substrate). Additionally, the substrate can include alternate materials to enhance physical properties (i.e. use of oriented monofilament or variable denier to reduce elongation). Use of flame-retardant or self-extinguishing component in substrate allow for protection of sensitive circuitry in case of catastrophic thermal failure.

Other features and advantages of the present invention will become readily apparent from the following detailed description, the accompanying drawings, and the appended claims.

DETAILED DESCRIPTION

Figure 1:
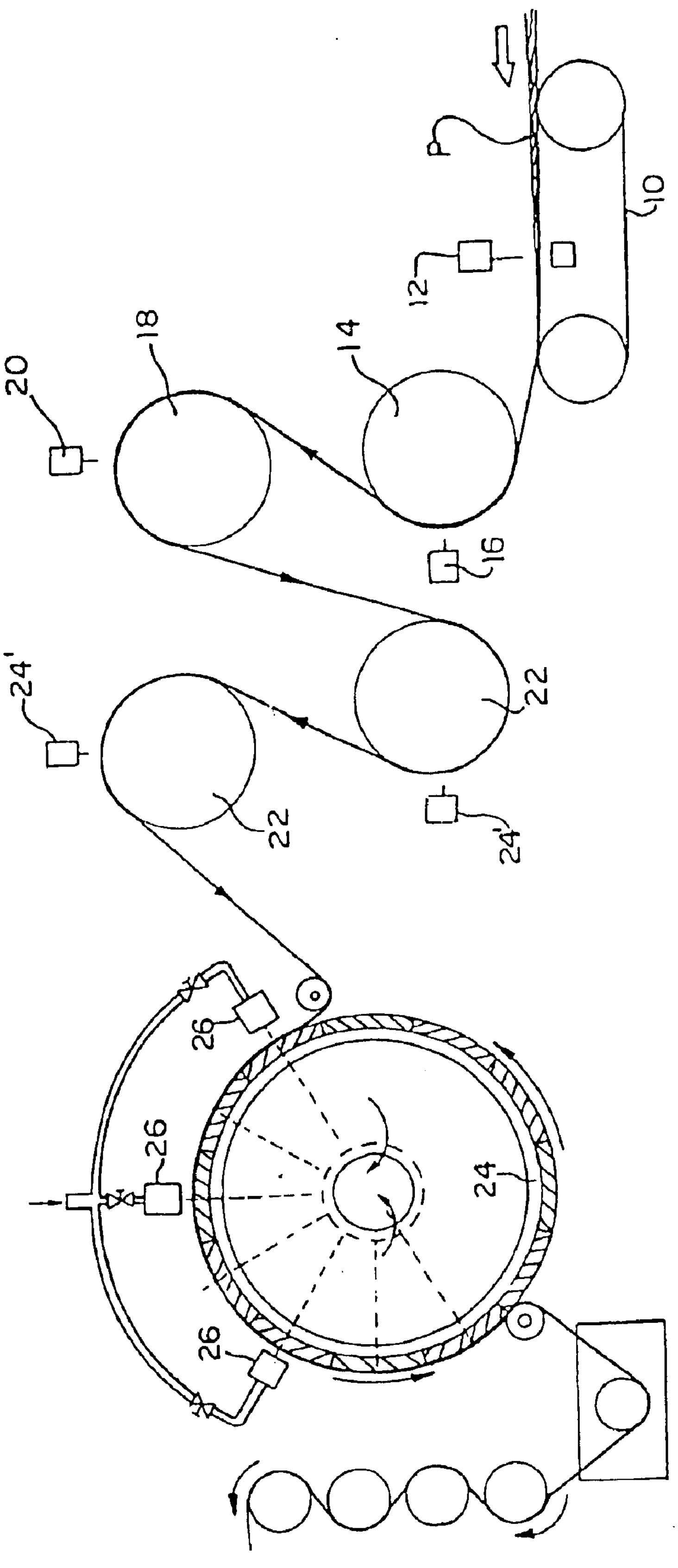
FIG. 1 is a diagrammatic view of an apparatus for manufacturing a nonwoven substrate, embodying the principles of the present invention.
Figure 2:
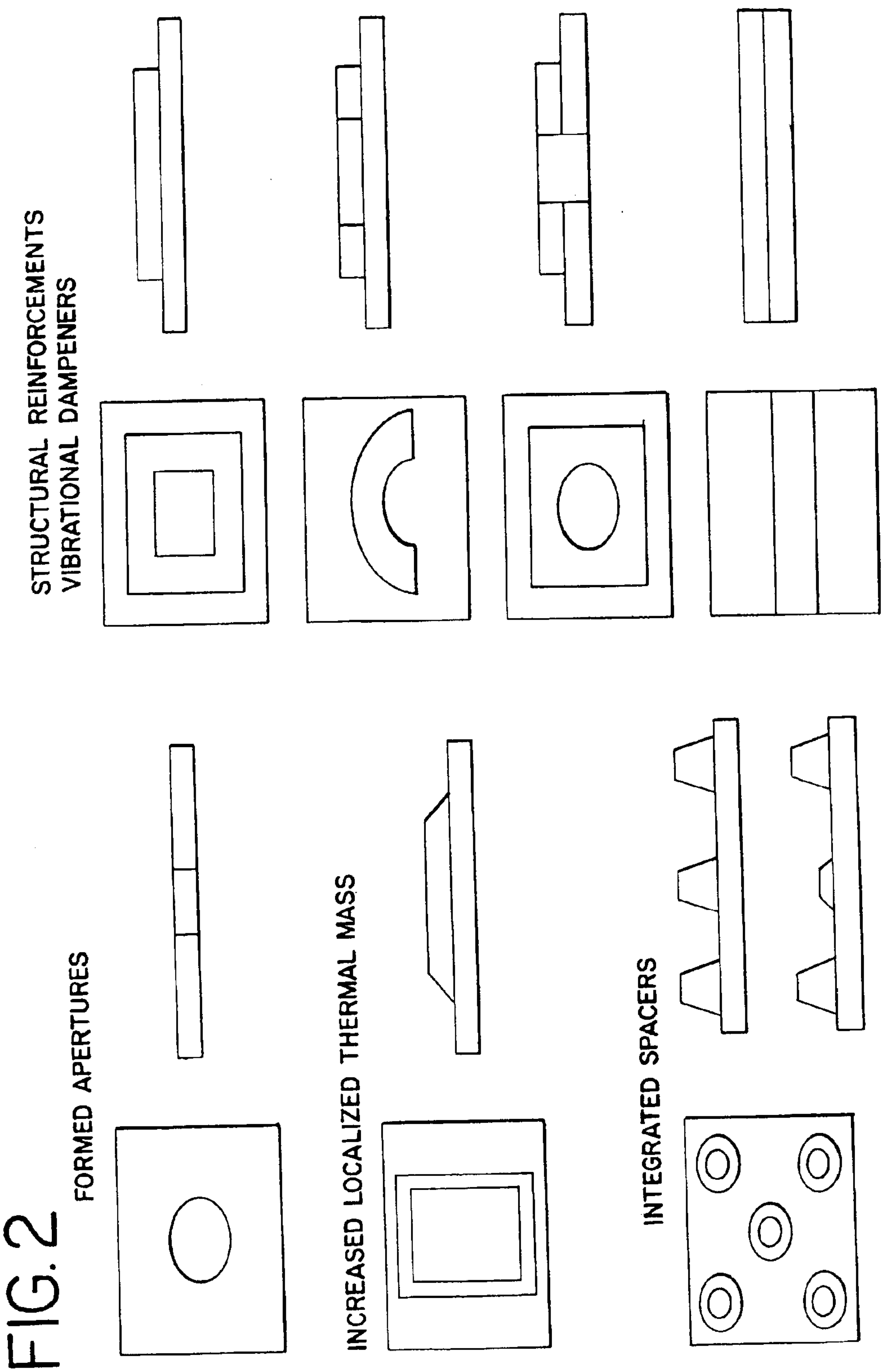
FIG. 2 depicts non-limiting examples of the construction of the nonwoven substrate of the present invention.
Figure 2:
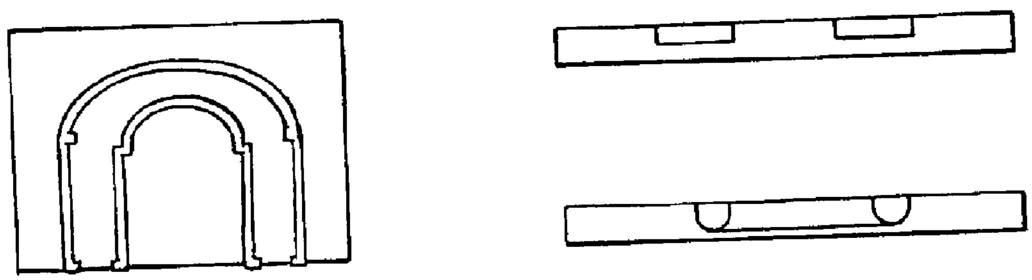
Figure 2:
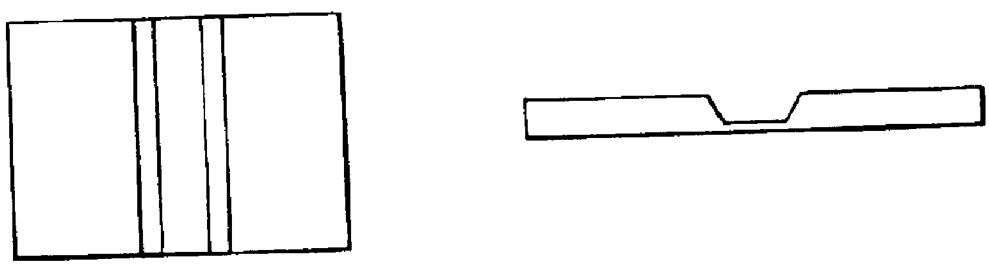
Figure 2:
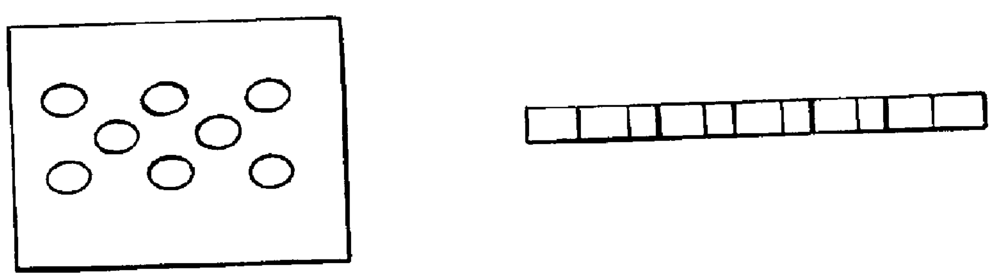
Figure 3:
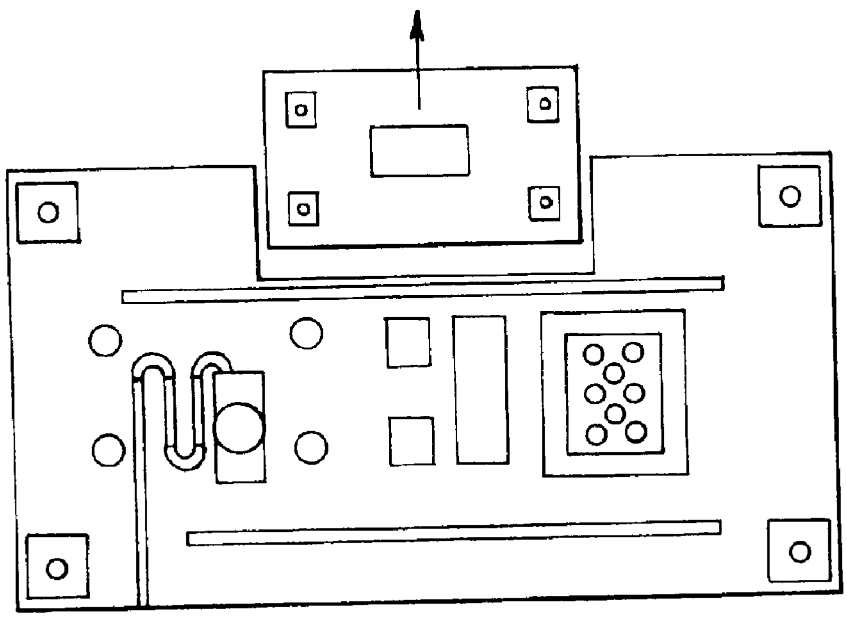
FIG. 3 depicts a circuit board without utilizing the substrate of the present invention and a circuit board utilizing the substrate of the present invention.
Figure 3:
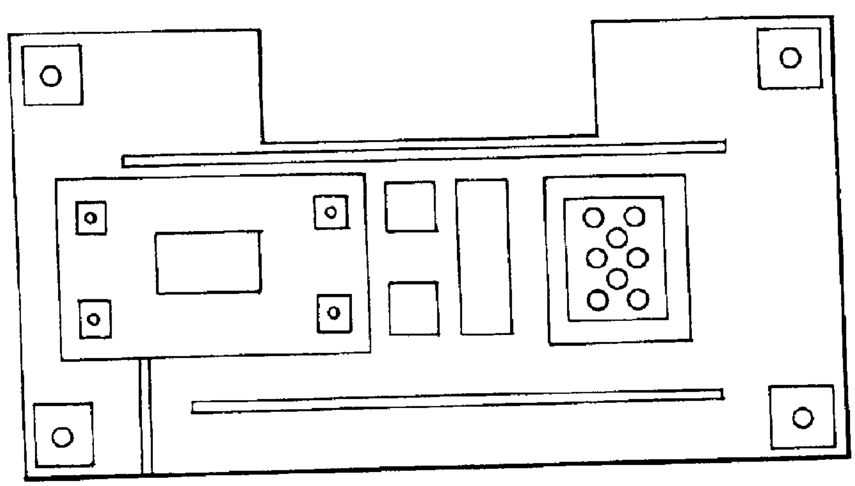
Figure 4:
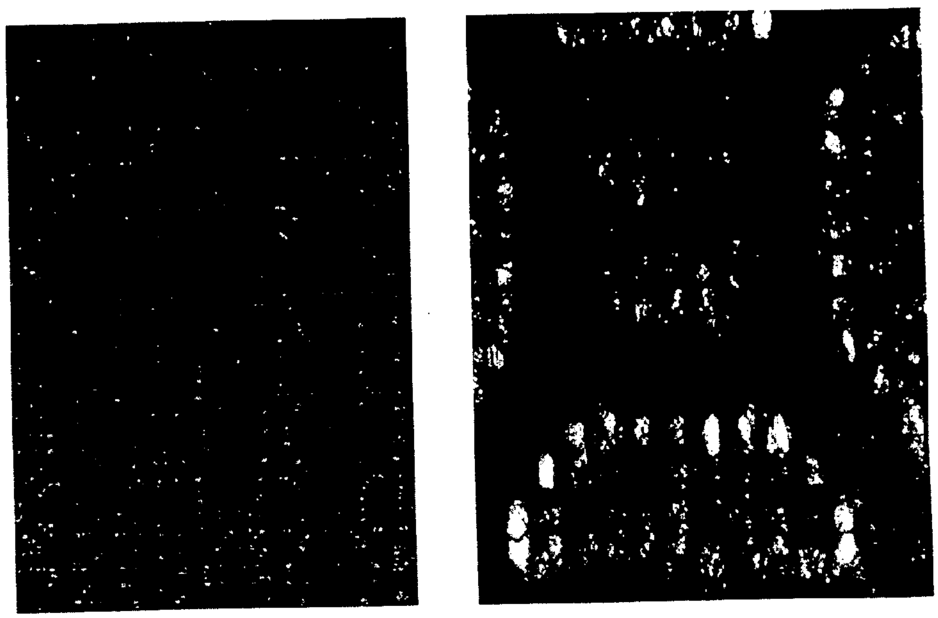
FIG. 4 is a photomicrograph of the nonwoven substrate made in accordance with the present invention.

While the present invention is susceptible of embodiment in various forms, there is shown in the drawings and will hereinafter be described a presently preferred embodiment of the invention, with the understanding that the present disclosure is to be considered as an exemplification of the invention, and is not intended to limit the invention to the specific embodiment illustrated.

Manufacture of a three-dimensionally imaged nonwoven substrate embodying the principles of the present invention is initiated by providing the fibrous matrix, which can include the use of staple length fibers, continuous filaments, and the blends of fibers and/or filaments having the same or different composition. Fibers and/or filaments are selected from natural or synthetic composition, of homogeneous or mixed fiber length. Suitable natural fibers include, but are not limited to, cotton, wood pulp and viscose rayon, flax, hemp, and kenaf. Natural fibers also include silicates, such as glass. Synthetic fibers, which may be blended in whole or part, include thermoplastic and thermoset polymers, including acrylics and polycarbonates. Thermoplastic polymers suitable for blending with dispersant thermoplastic resins include polyolefins, polyamides and polyesters. Thermoplastic aramids and melamines are particularly advantageous due to their high thermal stability. The thermoplastic polymers may be further selected from homopolymers; copolymers, conjugates and other derivatives including those thermoplastic polymers having incorporated melt additives or surface-active agents. Staple lengths are selected in the range of 0.25 inch to 10 inches, the range of 1 to 3 inches being preferred and the fiber denier selected in the range of 1 to 22, the range of 2.0 to 8 denier being preferred for general applications. The profile of the fiber and/or filament is not a limitation to the applicability of the present invention.

The substrate of the present invention may be comprised of a single fabric layer construct or a multi-layer construct. The layers can either be woven substrates, nonwoven substrates, or the combination thereof and may be of the same or differing composition. Further, the support substrate may be of a laminate or composite structure. Further still, the substrate can be integrated, wherein formation of the substrate includes alternate materials to impart different physical properties (i.e. incorporation of a carbon fiber into a PET nonwoven or a glass woven to create an electro conductive substrate). Additionally, the substrate can include alternate materials to enhance physical properties (i.e. use of oriented monofilament or variable denier to reduce elongation). Use of flame-retardant or self-extinguishing component in substrate allow for protection of sensitive circuitry in case of catastrophic thermal failure.

With reference to FIG. 1, therein is illustrated an apparatus for practicing the present method for forming a nonwoven substrate. The support substrate of the invention is manufactured in accordance with the techniques disclosed in U.S. Pat. No. 5,098,764, to Drelich, hereby incorporated by reference. The substrate is formed from a fibrous matrix, which typically comprises staple length fibers. The fibrous matrix is preferably carded and cross-lapped to form a precursor web, designated P. In a current embodiment, the precursor web comprises a majority of cross-lap fibers, that is, most of the fibers of the web have been formed by cross-lapping a carded web so that the fibers are oriented at an angle relative to the machine direction of the resultant web.

FIG. 1 illustrates a hydroentangling apparatus for forming nonwoven substrates in accordance with the present invention. The apparatus includes a foraminous-forming surface in the form of belt 10 upon which the precursor web P is positioned for pre-entangling by entangling manifold 12.

Pre-entangling of the precursor web, prior to three-dimensional imaging, is subsequently effected by movement of the web P sequentially over a drum 14 having a foraminous forming surface, with entangling manifold 16 effecting entanglement of the web. Further entanglement of the web is effected on the foraminous forming surface of a drum 18 by entanglement manifold 20, with the web subsequently passed over successive foraminous drums 22, for successive entangling treatment by entangling manifolds 24', 24'.

The entangling apparatus of FIG. 1 further includes an imaging drum 24 comprising a three-dimensional image transfer device for effecting imaging of the now-entangled precursor web. The image transfer device includes a moveable imaging surface which moves relative to a plurality of entangling manifolds 26 which act in cooperation with three-dimensional elements defined by the imaging surface of the image transfer device to effect imaging of the substrate being formed. Hydroentanglement results in portions of the precursor web being displaced from on top of the three-dimensional surface elements of the imaging surface to form a three-dimensionally imaged nonwoven substrate with interconnected regions of different densities.

Subsequent to three-dimensional imaging, the nonwoven substrate is impregnated with a durable resinous matrix so as to provide a stable support substrate for use with electrical components, such as a PBC. Specific durable resinous matrices that can be incorporated include, but are not limited to, thermoset resins, such as polyesters, epoxies, vinylesters, as well as phenolic resins, and may be applied by suitable or applicable means. The aforementioned resins are preferred due to their versatility and ease of use. Polyester and epoxy resins are suitable resins for the present invention due to their extreme hardness. The resultant nonwoven support substrate, impregnated with a resinous matrix, may also be utilized in other end-use applications including, but not limited to, wireless and satellite communication, computer/microprocessor architecture, and power supply devices.

Optionally, the nonwoven substrate can be treated with a performance modifying composition to further alter the substrate structure or to meet end-use article requirements. Fibers/filaments can have a modified surface energy, by way of coating or profile, to increase capillary wicking. An exemplary technique of modifying surface energy is to improved impregnation of the durable resinous matrix.

Utilizing the substrate of the present invention in circuit boards and other end-use applications, such as wireless and satellite communication, computer/microprocessor architecture, and power supply devices, benefits the device structurally, thermally, and electrically. Control of thermal expansion and propagation will reduce stress imparted to electronic components, in particular solder points and surface-mount electronics. It is known that stress results in ultimate decreased performance and failure of the device.

The nonwoven substrate can act as a variable, specific, and isolated dielectric substance. The variable dielectric region may be of a corresponding variance in bulk, or of uniform bulk and the variance a property of mass. The nonwoven substrate can be used for grounding purposes so as to impart a PCB with the ability to control the buildup of static charge and/or the ability to protect sensitive electronic components from overcharge, as well as provide a PCB with electro-magnetic shielding by dissipating an electrical charge induced by a magnetic field. The nonwoven substrate of the present invention exhibits a dielectric value that is fixed within any one of the interconnected regions.

It is in accordance with the present invention that the support substrate can be comprised of one or more apertures. The incorporation of several aperture uniformly spaced provides for an air-transfer grill within the support substrate. A portion of the support substrate may also be removable, wherein the removed portion of the substrate can be repositioned within the surface of the substrate. The substrate may be comprised of wire channels, which are embedded within the surface of the substrate. Further, the support substrate may be comprised of one or more protrudances, wherein the protrudance may be a series of integrated spacers or an increased localized thick mass that extended outwardly in the z-direction of the substrate. Structural reinforcements, live hinges, and vibrational dampers may also be incorporated into the support substrate.

Substrate of present invention capable of being supplied as either a continuous roll or is sheet form.

Other features and advantages of the present invention will become readily apparent from the following detailed description, the accompanying drawings, and the appended claim.

What is claimed:

1. A method of making a support substrate comprising:

a. providing a base substrate;

b. providing a three-dimensional foraminous surface;

c. providing a resinous matrix;

d. advancing said base substrate onto said three-dimensional base substrate;

e. hydroentangling said base substrate onto said three-dimensional foraminous surface so as to impart said substrate with a corresponding three-dimensional image; and f. applying said resinous matrix onto said base substrate, said base substrate exhibiting a plurality of interconnected regions of different density or composition, said base substrate exhibiting a dielectric value that is fixed within any one of the interconnected regions.

2. A method of making a support substrate in accordance with claim 1, wherein said base substrate is selected from the group consisting of staple length fibers, continuous filaments, and blends thereof.

3. A method of making a support substrate in accordance with claim 2, wherein base substrate is selected from the group comprising thermoplastic fibers, natural fibers, thermoset fiber, and the combination thereof.

4. A method of making a support substrate in accordance with claim 3, wherein said thermoplastic fibers are selected from the group comprising polyolefins, polyamides, polyesters and the combinations thereof.

5. A method of making a support substrate in accordance with claim 3, wherein said natural fibers are selected from the group comprising cotton, wood pulp, viscose rayon, flax, hemp, kenaf, and the combinations thereof.

6. A support substrate for electronic circuitry formed in accordance with the method of claim 1.

7. A support substrate in accordance with claim 6, wherein said support substrate comprises a portion that is removable.

8. A support substrate in accordance with claim 7, wherein said removable portion of said support substrate may be repositioned within said support substrate.

9. A support substrate as in claim 6, wherein said substrate is comprised of at least one aperture.

10. A support substrate as in claim 6, wherein said support substrate is comprised of at least one increased localized thermal mass protruding from said substrate.

11. A support substrate as in claim 6, wherein said support substrate is comprised of integrated spacers of the same scale or of differing scales that protrude from said substrate.

12. A support substrate as in claim 6, wherein said support substrate is comprised of structural reinforcements that protrudes from said substrate.

13. A support substrate as in claim 12, wherein said structural reinforcement is comprised of at least one aperture.

14. A support substrate as in claim 6, wherein said support substrate is comprised of wiring channels that are embedded within the surface of said substrate.

15. A support substrate as in claim 6, wherein said support substrate is comprised of a live hinge.

16. A support substrate as in claim 6, wherein said support substrate is comprised of an air-transfer grill.

* * * * *